US006697384B2

(12) United States Patent
Asano

(10) Patent No.: US 6,697,384 B2
(45) Date of Patent: Feb. 24, 2004

(54) METHOD AND APPARATUS FOR CALCULATING A STATE OF STARTING A PN CODE GENERATING OPERATION

(75) Inventor: Nobuo Asano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 219 days.

(21) Appl. No.: 09/916,284

(22) Filed: Jul. 30, 2001

(65) Prior Publication Data

US 2002/0019840 A1 Feb. 14, 2002

Related U.S. Application Data

(62) Division of application No. 09/139,325, filed on Aug. 25, 1998, now Pat. No. 6,295,301.

(30) Foreign Application Priority Data

Sep. 2, 1997 (JP) .............................................. 9-252872

(51) Int. Cl.[7] .................................................. H04J 3/06
(52) U.S. Cl. ...................................... 370/514; 370/342
(58) Field of Search ............................ 331/78; 370/342, 370/514, 515; 375/133, 206, 130, 343; 708/253

(56) References Cited

U.S. PATENT DOCUMENTS

RE33,875 E * 4/1992 Tsuchiya .................... 375/343
5,228,054 A    7/1993 Rueth et al.
5,400,359 A *  3/1995 Hikoso et al. .............. 375/133
5,519,736 A    5/1996 Ishida
5,532,695 A    7/1996 Park et al.
6,295,301 B1 * 9/2001 Asano ........................ 370/514
6,473,447 B1 * 10/2002 Strich et al. ................ 375/130

FOREIGN PATENT DOCUMENTS

JP          07183869        7/1995
JP            818550        1/1996
JP          08321804       12/1996

OTHER PUBLICATIONS

Japanese Office Action dated Dec. 25, 2001.

Japanese Office Action dated Oct. 29, 2002.

* cited by examiner

*Primary Examiner*—Salvatore Cangialosi
(74) *Attorney, Agent, or Firm*—Stevens, Davis, Miller & Mosher, LLP

(57) ABSTRACT

An apparatus is provided that calculates a state at a time of starting an operation of a shift register that generates a PN code. The apparatus includes a system that obtains a parameter "i" that pertains to the state at the time of starting an operation, a system that obtains coefficients of a generator polynomial corresponding to the PN code, and a system that calculates the state at the time of starting an operation, based on the parameter "i" and the coefficients of the generator polynomial.

24 Claims, 7 Drawing Sheets

| | $X^0$ | $X^1$ | $X^2$ |
|---|---|---|---|
| STATE AT A CERTAIN TIME T | 0 | 0 | 1 |
| STATE AT T+1 | 1 | 1 | 0 |
| STATE AT T+2 | 0 | 1 | 1 |
| STATE AT T+3 | 1 | 1 | 1 |
| STATE AT T+4 | 1 | 0 | 1 |
| STATE AT T+5 | 1 | 0 | 0 |
| STATE AT T+6 | 0 | 1 | 0 |
| STATE AT T+7 | 0 | 0 | 1 |

| | $X^0$ | $X^1$ | $X^2$ |
|---|---|---|---|
| INITIAL VALUE | 0 | 0 | 0 |
| INPUT 1 | 1 | 1 | 1 |
| INPUT 0 | 1 | 0 | 1 |
| INPUT 0 | 1 | 0 | 0 |

METHOD AND APPARATUS FOR CALCULATING A STATE OF STARTING A PN CODE GENERATING OPERATION

This is a division of U.S. patent application Ser. No. 09/139,325, filed Aug. 25, 1998, pending, the contents of each of which are expressly incorporated by reference herein their entireties, now U.S. Pat. No. 6,295,301.

BACKGROUND OF THE INVENTION

1. Field of the Invention

The present invention relates to a PN code generating apparatus applicable to a mobile device in a mobile communication system in which an intermittent reception is performed, for instance a CDMA (Code Division Multiple Access) communication system, and to a mobile radio communication system.

2. Description of the Related Art

Recently a mobile communication using a CDMA system has attracted public attention in a digital mobile communication field. In the U.S.A., the standardization of a mobile communication system in a CDMA system was performed by TIA (Telecommunications Industry Association), which is summarized in "Mobile Station-Base Station Compatibility Standard for Dual Mode Wideband Spread Spectrum Digital Cellular System" (IS-95-A) and so on.

In a CDMA system, transmission data are specturm spread with a spreading code that is different each channel. For instance, in IS-95-A includes a short PN code of 15th order (the period is about 26 ms) and a long PN code of 42th order (the period is about 41 days) consumed in spectrum spreading. And the long PN code is also used in the scramble for a forward link and in the assigning of an insert position of power control bit.

FIG. 1 illustrates a schematic configuration of a conventional PN code generating apparatus. As an example, the case of PN code of 42th order, which requires 42 delay elements in a shift register, is illustrated. PN code generating section 100 comprises a feedback shift register composed of 41 EX-ORs (EXclusive-OR circuit) 101, 42 one-clock-delay elements 102, 42 primitive polynomial coefficients g0 up to g41 and 42 multipliers 103.

In the PN code generating apparatus described above, the initial values of delay elements are set so that all values are not 0 at the same time, and the value of delay elements 102 is shifted corresponding to an input of shift clock 104 considering the feedback of the value of the last slot.

Any output of delay element is obtained as a PN code.

In a CDMA mobile communication system, a mobile device sets the initial value of delay element 102 at a system timing in the process of the synchronization acquisition with a base station, then generates a PN code using a chip rate consumed in spreading in a CDMA system as a shift clock.

A mobile device in a mobile communication system performs the monitoring reception to check a call once in the specific period predetermined with a base station while waiting. This is called an intermittent reception, in which as many circuits as possible except a timer for measuring a timing for the next monitoring reception are turned off during the non-reception period so as to reduce the consumed electric power.

However in a conventional PN code generating apparatus, since it is necessary to keep the synchronization of a code pattern of a long PN code with much longer period than the intermittent reception period even during the non-reception period, it is not possible to turn off the apparatus, which brought the problem that the reduction of electric power can not be achieved.

SUMMARY OF THE INVENTION

The present invention is carried out taking into account the above facts. The object of the present invention is to provide a PN code generating apparatus and method capable of acquiring the synchronization of long PN code immediately when the apparatus is restart after the stop state in an intermittent reception.

The first aspect of the present invention adopts the constitution comprising a PN code generating section for generating PN code has predetermined length using primitive polynomial G(x), then shifting the code content, and a state setting section for obtaining a code state of the PN code generating section after shifted the specific times from a code state of the PN code generating apparatus at a certain time, based on $x^i \bmod G(x)$ as the number of shifts is i.

First $x^i \bmod G(x)$ is calculated or obtained in advance where i is the number of shifts that should be necessary for a PN code generating apparatus in the case where it is assumed to be operating during the period from the turn-off to the next turn-on. The state at which the PN code generating apparatus is supposed to be when the next turn-on is obtained using $x^i \bmod G(x)$, which indicates only the number of the shifts corresponding to the length of a PN code (42 shifts in this example) is enough to obtain the state of a PN code generating apparatus (the content of delay element) just after turned on using the state of the PN code generating apparatus (the content of delay element) just before turned off. Accordingly, it is possible to calculate the state of the PN code generating apparatus at the time of restarting a monitoring reception, while the PN code generating apparatus is turned off during the non-reception time and turned on just before the timing of the next monitoring reception. That allows to keep the PN code generating apparatus turn-off during almost of the non-reception time, which results in the reduction of the consumed electric current.

The second aspect of the present invention comprises a masking calculating section for acquiring the number of shifts: i corresponding to a period until a PN code generating apparatus restarts next to calculate $x^i \bmod G(x)$.

It is possible to make a PN code generating apparatus the code state holding the synchronization with much less number of shifts than the number of shifts: i by providing i to a masking calculating section.

The third aspect of the present invention comprises a masking table in which a plurality of $x^i \bmod G(x)$ obtained to a plurality of the number of shifts selected in advance are registered as a masking value, and a masking setting section for reading out the masking value from the masking table based on a value of n to obtain a status of a PN code generating apparatus after n*T time (n is an integer number) where the minimum period to calculate the target state of a PN code generating apparatus is T.

It is possible to obtain the state of a PN code generating apparatus after shifted the specific times from the state of the PN code generating apparatus at a certain time with only the number of shifts that is an integer times of the delay elements of the sift register.

DESCRIPTION OF THE PREFERRED EMBODIMENT

Before explaining the preferred embodiments of the present invention in detail, an explanation is given to the calculation principle to obtain the state of a PN code generating apparatus after shifted the specific times from the state of a PN code generating apparatus at a certain time.

First consider a cyclic code. A cyclic code (n,k) (n: code length, k: information bit length) is obtained as a remainder when $M(x)x^{n-k}$ is divided by $G(x)$, where a polynomial with a information bit as a efficient is represented as $M(x)$ of (k−1)th order, and a generation polynomial is represented $G(x)$ of (n−k)th order, which is shown in the following formulation.

$$M(x)x^{n-k}=Q(x)G(x)+R(x) \quad (1)$$

Herein, $R(x)$ of (n−k−1)th order is a remainder polynomial to give a redundancy bit.

Formulation (1) is transformed as shown below.

$$M(x)x^{n-k}-R(x)=Q(x)G(x) \quad (2)$$

That results in a code word $M(x) x^{n-k}-R(x)$ that can be divided by $G(x)$ without a remainder.

Figure 1:
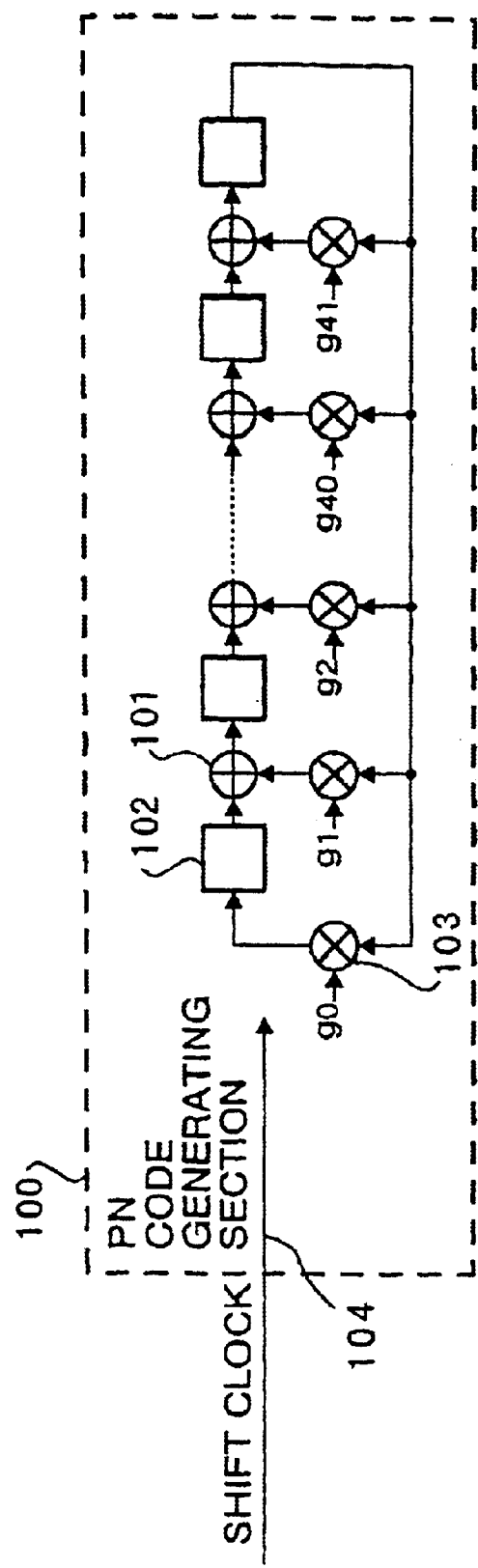
FIG. 1 is a schematic diagram of a conventional PN code generating apparatus.
Figure 2:
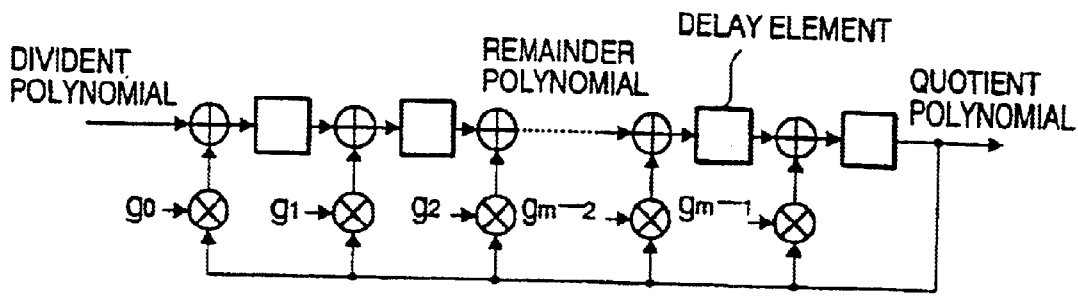
FIG. 2 is a configuration diagram of a feedback shift register with a general subtracter circuit.

A division circuit for $$G(x)=X^m+g_{m-1}X^{m-1}+ \ldots +g1x+g0(m=n-k)$$

is generally achieved using a feedback shift register illustrated in FIG. 2.

To obtain $R(x)$ in formulation (1) using the circuit in FIG. 2, k bits from the coefficients with higher orders of $M(x)$ are inputted sequentially to the left input, and (n-k) bits of 0 are inputted. Then the remainder corresponding to a coefficient of $R(x)$ is obtained in m numbers of delay elements in the feedback shift register. Herein, to input (n-k) bits of 0 is equivalent to (n-k) bits of lower orders when n bits from the coefficients with higher orders of $M(x)$ are inputted.

Figure 3:
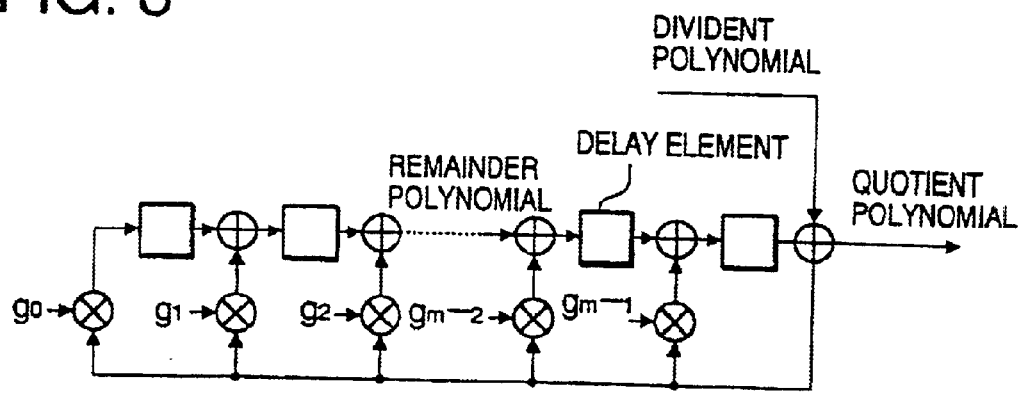
FIG. 3 is a configuration diagram of a feedback shift register with the partially improved subtracter circuit illustrated in FIG. 2.

However it is obvious that (n-k) bits of 0 should be inputted in the configuration in FIG. 2, which is modified to the configuration in illustrated in FIG. 3. In this configuration, to input k bits from the coefficients with higher orders of $M(x)$ is enough to obtain a remainder corresponding to a coefficient in m numbers of delay elements in the feedback shift register. This configuration results in the equivalent to multiply $x^{n-k}$ automatically by modifying an input position of a coefficient of divided polynomial from the least order to the highest order of a generation polynomial. Generally a cyclic code is calculated using a feedback register configured as illustrated in FIG. 3.

Figure 4:
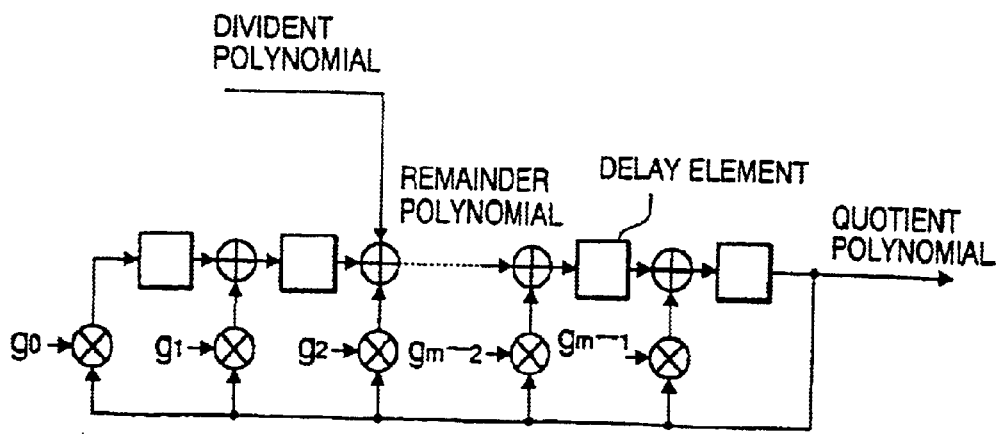
FIG. 4 is a configuration diagram of a feedback shift register to obtain the remainder of polynomial $M(x)x^2$.

FIG. 3 illustrates a circuit to obtain a remainder of polynomial $M(x) x^{n-k}$. By applying this property, a circuit to obtain a remainder of polynomial $M(x) x^2$ is as illustrated in FIG. 4. That is, in the case of obtaining a remainder of polynomial $M(x) x^i$ ($i \leq m$), an input is executed to an EX-OR (EXclusive OR circuit) corresponding to i order in the feedback shift register. And in the case of obtaining a remainder of polynomial $M(x)(x^i+x^j)(i!=j,i, j \leq m)$, inputs are executed to EX-ORs corresponding to i order and j order respectively at the same time in the feedback register, which is obvious from its characteristics.

Next consider the case of obtaining a remainder of $M(x) x^i$ when i>m.

Formulation (3) below is obtained by replacing n-k in formulation (1) with i.

$$M(x)x^i=Q(x)G(x)+R(x) \quad (3)$$

Formulation (3) is also expressed in another formulation below.

$$R(x)=M(x)x^i \bmod G(x) \quad (4)$$

Using the characteristics of the remainder calculation, formulation (4) is transformed as shown below.

$$R(x)=M(x)(x^i \bmod G(x)) \bmod G(x) \quad (5)$$

$$R(x)=M(x)S(x) \bmod G(x) \quad (6)$$

Where $S(x)=x^i \bmod G(x)$ and $S(x)$ is a polynomial of less than m−1 order. According to orders which coefficient are 1 in $S(x)$, by inputting k bits from a coefficient with a higher order in $M(X)$ to each EX-OR sequentially in a feedback register (division circuit) at the same time, a remainder is obtained even in the case of $M(x) x^i$ (i>m).

The technical subject to obtain the state of a PN code generator (the contents of shift register) after shifted the specific times from the state of the PN code generator at a certain time without the number of shifts is solved by applying the above principle.

It is assumed that a primitive (generator) polynomial of a PN code generator is $G(x)$(m order) and the state of the PN code generator at a certain time is $M(x)$(m order). However the configuration of a PN code generator is composed of a configuration illustrated in FIG. 2 except an input of a divident polynomial, expediently a PN code generator with the input is assumed. In FIG. 2, the content of each shift register is 0 after cleared. That state is changed to the state of a PN code generator at a certain time after sequentially inputting m bits from a coefficient with the highest order in $M(x)$ to a left input. To obtain the state of the PN code generator when shifted the specific times (1 times) from the certain time, i bits of 0 are sequentially inputted to the left input, which is equivalent to an operation of an ordinary PN code generator. This operation is also equivalent to obtain the remainder of $M(x)x^i$ from the view of the division.

Therefore, by obtaining $x^i$ mod G(x) and sequentially inputting m bits from a coefficient with the highest order in M(x) according to the each order of coefficient 1 of $x^i$modG(x) to each EX-OR of a feedback register (division circuit), the state when shifted i times (remainder) is obtained.

Accordingly, by obtaining $x^i$ mod G(x) in advance, it is possible to obtain the state after shifted i times with only the m bit shift times, which permits to drastically reduce the number of gate ON/OFF times in the case of CMOS circuit, even though a few additions are necessary in a division circuit. The basic principle is as described above.

An example is illustrated in detail with third order polynomial G(x)=$x^3$+x+1.

Figure 5:
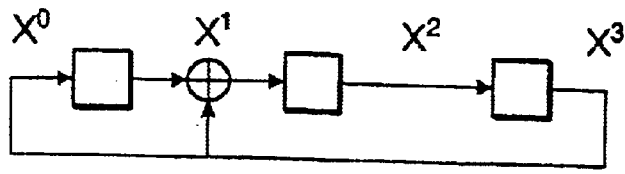
FIG. 5 is a diagram illustrating a configuration of a PN code generating apparatus and the change of its status from a certain time.

G(x) generates a PN code of $2^3$−1 period. FIG. 5 illustrates a configuration and the changes of state during a bit is shifting from the state at a certain time; t of a PN code generator. An explanation is given to obtain the state after five shifts from starting the state at a certain time; t, using the above-mentioned principle.

First is to obtain $x^i$ mod G(x).

$$\begin{array}{r}
x^2 + 1 \phantom{xxxxxx} \\
x^3+x+1 \overline{)x^5 \phantom{xxxxxxx}} \\
\underline{x^5 + x^3 + x^2} \phantom{x} \\
x^3 + x^2 \phantom{xx} \\
\underline{x^3 \phantom{xxx} + x + 1} \\
x^2 + x + 1 \quad \text{remainder}
\end{array}$$

Figure 6:
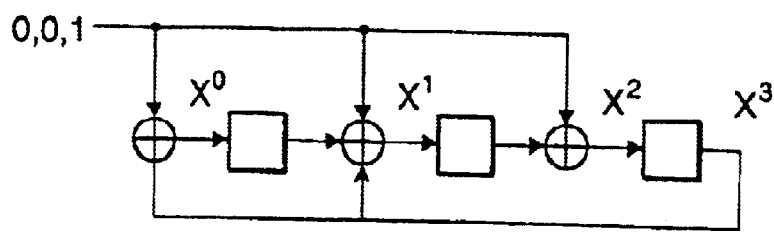
FIG. 6 is a configuration of a PN code generating apparatus configured based on the remainder.

Based on the obtained remainder, 1, 0 and 0 according to this order are inputted in the configuration illustrated in FIG. 6. The last state illustrated in FIG. 6 is obviously the same as the state at t+5 in FIG. 5.

Thus it is possible to obtain the state of a PN code generator (the contents of shift register) after shifted the specific times from a certain time without shifting the specific times, using the state of the PN code generator at the certain time.

The embodiments of the present invention are explained in detail with reference to drawings in the following.

(First Embodiment)

Figure 7:
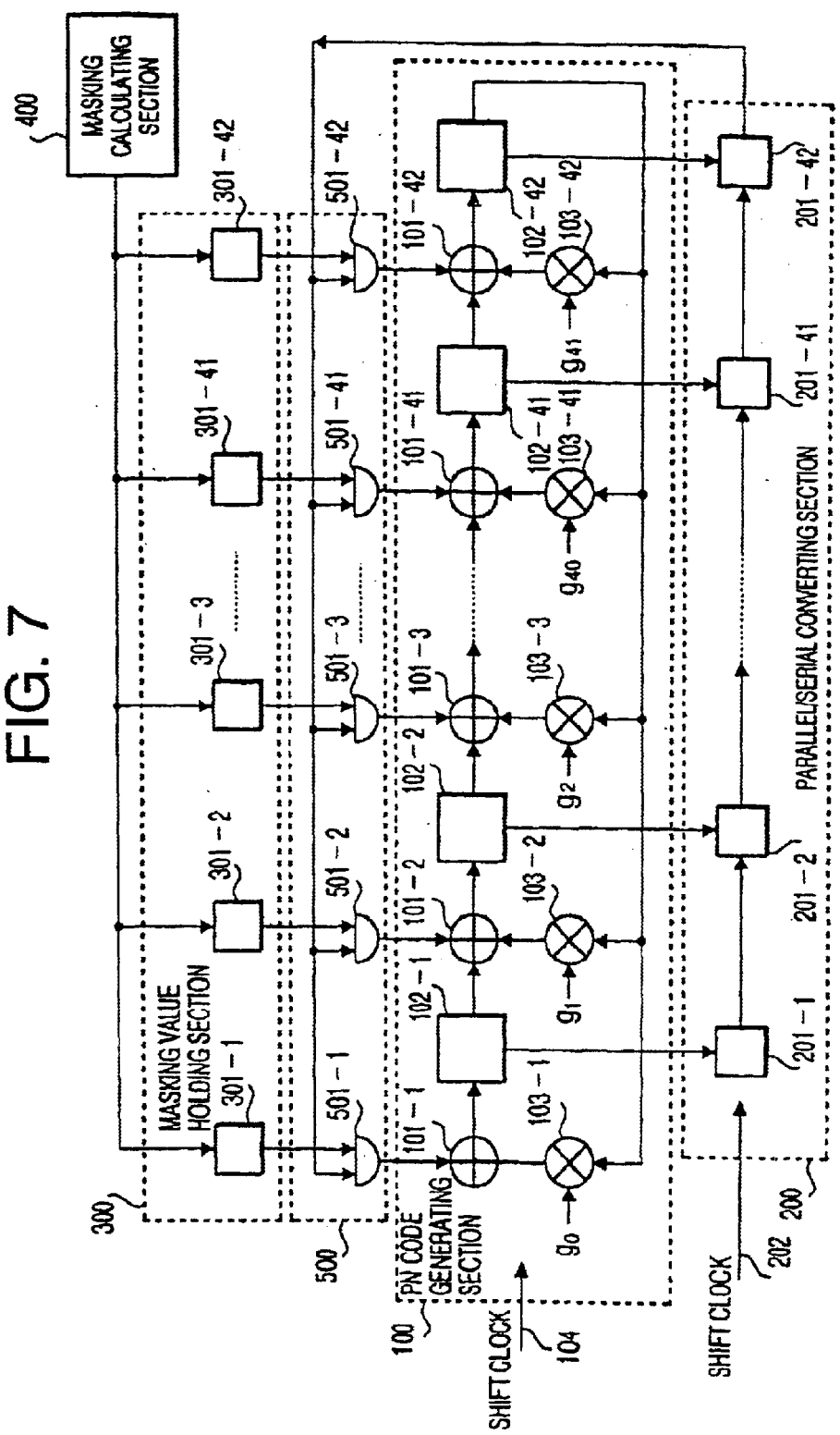
FIG. 7 is a schematic configuration diagram of a PN code generating apparatus in the first embodiment of the present invention.

FIG. 7 is a diagram illustrating a schematic configuration of a PN code generating apparatus in the first embodiment of the present invention. A PN code generating apparatus in this embodiment comprises PN code generating section 100 for generating PN code of 42 stages, parallel/serial converting section 200 for parallel/serial converting the content of a delay element of PN code generating section 100, masking value holding section 300 for holding a masking value, masking calculating section 400 for calculating a masking value which is to be hold in masking value holding section 300, AND block 500 for calculating AND of an output in masking value holding section 300 and an output in parallel/serial section 200.

In PN code generating section 100, 42 EX-ORs 101-1 up to 101-42 are serial connected, and 42 delay elements 102-1 up to 102-42 are serial inserted after an output of EX-ORs 101-1 up to 101-42 respectively. And 42 multipliers 103-1 up to 103-42 are prepared respectively corresponding to EX-ORs 101-1 up to 101-42. Each of multipliers 103-1 up to 103-42 multiplies respectively each of primitive polynomial coefficients go up to g41 and an output in the last delay element 102-42 to output a multiplied value to each EX-ORs 101-1 up to 101-42 respectively. A feedback register is composed of 42 EX-ORs 101-1 up to 101-42, 42 delay elements 102-1 up to 102-42 and 42 multipliers 103-1 up to 103-42 in which 42 primitive polynomial coefficients are respectively multiplied. The initial value setting is executed so that initial values of delay elements 102-1 up to 102-42 are not all 0 at the same time. The value of delay element is shifted each input of shift clock 104 considering the feedback of the last stage value. A PN code is obtained by fetching an output of any delay element.

Parallel/serial converting section 200 is composed of 42 serial connected latching sections 201-1 up to 201-42. Latching sections 201-1 up to 201-42 respectively latches into the content of delay elements, and transfer the latched content to a neighboring latter latching section. In other word, parallel/serial converting section 200 latches into the PN code of 42 stages parallel inputted from PN code generating section so as to serial output working as a shift register.

Masking value holding section 300 is composed of 42 latching sections 301-1 up to 301-42 each prepared corresponding to each EX-ORs 101-1 up to 101-42 in PN code generating section. Latching sections 301-1 up to 301-42 are to latch into the masking value calculated in masking calculating section 400.

Masking calculating section 400 obtains the number of shift times which is the required number of shift times in PN code generating section 100 to calculate the state (the content of delay element 102) of PN code generating section 100 at the specific time after the state (the content of delay element 102) of PN code generating section 100 at a certain time. S(x)=$x^i$modG(x) is obtained by replacing i of $x^i$modG(x) in Formulation (6) with the obtained number of shift times.

AND block 500 is composed of 42 AND gates 501-1 up to 501-42 each prepared between each of latching sections 301-1 up to 301-42 in masking value holding section 300 and each of EX-ORs 101-1 up to 101-42 in PN code generating section 100.

Figure 8:
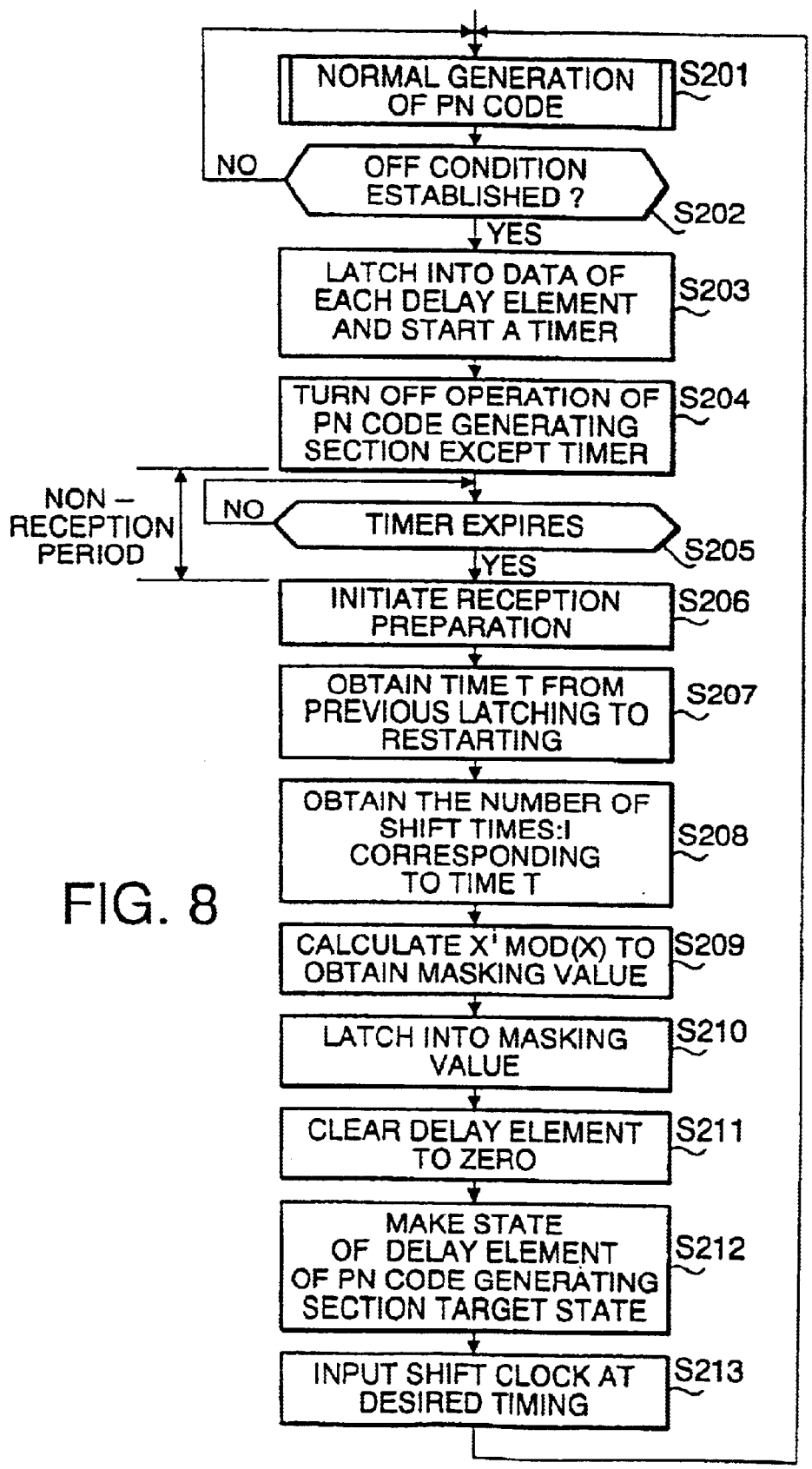
FIG. 8 is a flow chart to calculate the state at a PN code generating apparatus in the first embodiment of the present invention.

An operation of the PN code generating apparatus configured as described above is explained with reference to a flow chart in FIG. 8.

Now PN code generating section 100 is executing the normal code generation (S201). When it is judged that the predetermined condition is established to turn off PN code generating section 100 (S202), latching sections 201-1 up to 201-42 each latches into each content of delay elements 102-1 up to 102-42 respectively, and the internal timer starts concurrently (S203). And the operation in PN code generating section 100 except the timer is turned off (S204).

Next after the timer expires (S205), a receiving preparation is initiated (S206). The time set in the timer is a little shorter time than next monitor receiving timing, including an estimated time for the process that masking calculating section 400 calculates a mask value.

As the receiving preparation is initiated, first the period time to restart PN code generation section 100 from previously latching sections 201-1 up to 201-42 latched into the content of PN code generating section 100 is obtained (S207). Next the number of shift times in code generating section corresponding to this period time until restarting is obtained, and the obtained number of shift times is assigned as i (S208). Then masking calculating section 400 calculates $x^i$modG(x) to obtain a masking value (S209).

Each of latching sections 301-1 up to 301-42 in masking value holding section 300 holds the masking values calculated in masking calculating section 400 (S210). Next delay elements 102-1 up to 102-42 in PN code generating section 100 are cleared to 0 (S211).

Using latching sections 201-1 up to 201-42 in parallel/serial converting section 200 having the latched contents of delay elements 102-1 up to 102-42 that is equivalent to the previous state of PN code generating section as a shift register, the number of clocks corresponding to the number of stages for a PN code (in this case, 42 clocks) are inputted as shift clock 202 and shift clock 104 to PN code generating section 100, the target state of PN code generating section 100 is obtained (S212).

When the state of PN code generating section 100 reaches the state after shifted the specific times (i), shift clock 104 is inputted at the desired timing corresponding to the number of shifts (i), and the generation of PN code is initiated in PN code generating section 100 (S213).

Thus, it is possible to calculate the state of a PN code generator after shifted the specific times from the state of a PN code generator (the content of a shift register) at a certain time with less number of shifts than the specific number of shift times, which enables to turn off a PN code generating section during a non-reception period in an intermittent reception system.

For instance, in a CDMA mobile communication system according to IS-95-A, the minimum non-reception period is 1.28 s, and a used shift clock is 1.2288 MHz. When it is assumed that 80 ms in 1.28 s is used in monitoring reception, about 1.20 s is for a non-reception period, which corresponds to 1,474,560 shift times.

By applying the above embodiment, it is possible to calculate the next state with 42 shift times just before the monitoring restarts instead of moving a PN code generating section 1,474,560 shift times, which reduces the (1,474,560-42) shift times of operations of a PN code generating section.

In addition, in the first embodiment described above, a period time until restarting is obtained at step S206. However it is possible to obtain the number of shift times during a period to restart in advance because the non-reception period is already known. In the case where the number of shift times is acquired in advance directly, like this case, it is not necessary to always calculate the period.

(Second Embodiment)

A PN code generating apparatus in the second embodiment of the present invention comprises masking value table 601 in which a plurality of pre-calculated masking values are stored, and masking setting instructing section 602 for selecting a masking value in mask table 601 to be used, instead of masking calculating section 400 in the first embodiment of the present invention.

Figure 9:
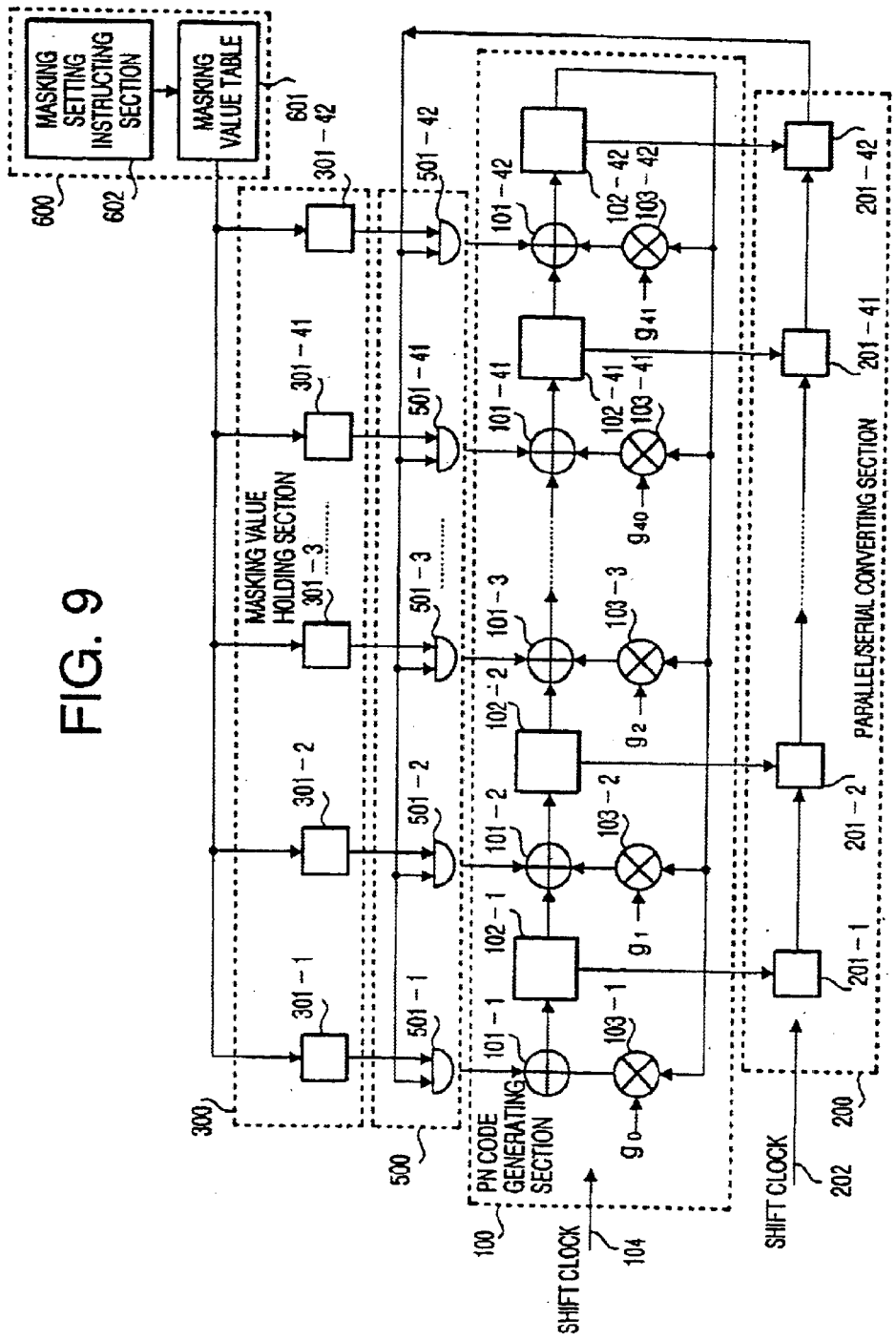
FIG. 9 is a schematic configuration diagram of a PN code generating apparatus in the second embodiment of the present invention.

FIG. 9 illustrates a diagram of a schematic configuration of a PN code generating apparatus in the second embodiment of the present invention. In addition, the same part as that in the first embodiment described above has the same symbol. In FIG. 9, 100 denotes a PN code generating section 100 that is the same as a conventional one, and the feedback register is composed of 42 EX-OR 101-1 up to 101-42, delay elements 102-1 up to 102-42 and multiplier 103-1 up to 103-42 for multiplying 42 primitive polynomial coefficients g0 up to g41. 200 denotes a parallel/serial converting section, which is composed of latching section 201-1 up to 201-42 each for latching into each of content of delay elements 102-1 up to 1-2-42 in PN code generating section 100. 300 denotes a masking holding section, and 500 denotes AND block.

In masking table 601, pre-calculated masking values, for instance, for $2^i \times T(i>0)$ are registered, as T is the minimum period to obtain the state of PN code generating section 100 by calculating.

Masking setting instructing section 602 controls a masking value read from masking table 601 based on the value of n, to calculate the state of PN code generating section 100 (the content of delay element S) n×T time (n is an integral number) after the state of PN code generating section 100 (the content of delay elements) at a certain time.

Figure 10A:
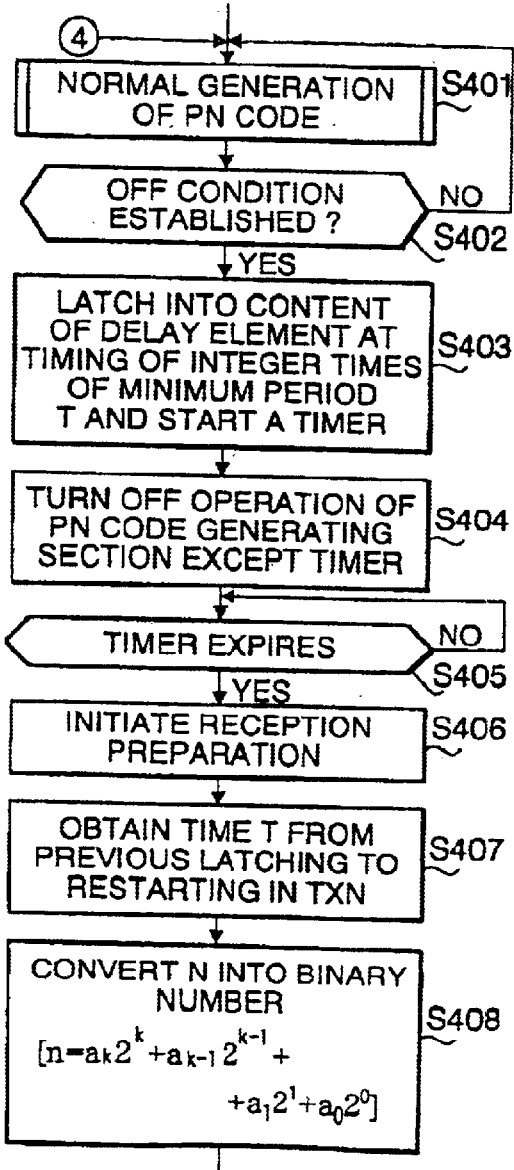
FIGS. 10A and 10B is a flow chart to calculate the state at a PN code generating apparatus in the second embodiment of the present invention.
Figure 10B:
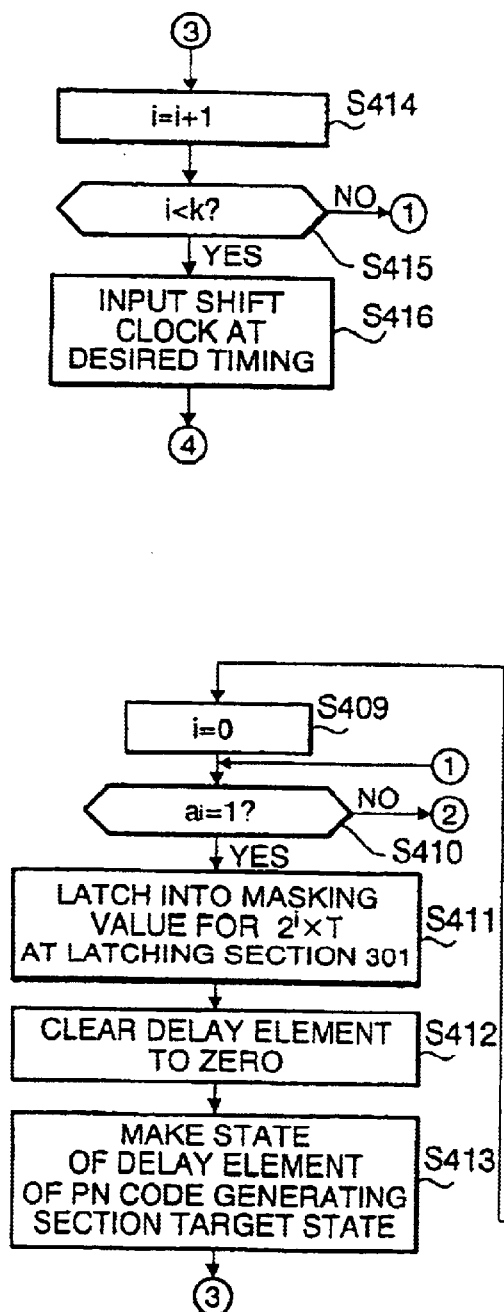

An operation of a PN code generating apparatus configured described above is explained using a flow chart in FIG. 10.

Now PN code generating section 100 is executing the normal code generation (S401). When it is judged that the predetermined condition is established to turn off PN code generating section 100 (S402), latching sections 201-1 up to 201-42 each latches each content of delay element 102-1 up to 102-42 respectively at a timing so that a period time until restarting is an integer times of the minimum period time T, and an internal timer starts concurrently (S403). And the operation in PN code generating section 100 except the timer is turned off (S404).

Next after the timer expires (S404), a receiving preparation is initiated (S406). The time set in the timer is a little shorter time than next monitor receiving timing, which is the same as the first embodiment.

As the receiving preparation is initiated, masking setting instructing section 602 obtains the period time until restarting PN code generation section 100 from previously latching sections 201-1 up to 201-42 latched into the content of PN code generating section 100 as n×T (n is an integral number) (S407).

The n of the period time until restarting (n×T) is converted into binary number (S408). And it is judged whether or not $a_j=1$ as j=0 (S409 and S410). When the result shows $a_j=1$, masking setting instructing section 602 reads out a masking value for predetermined $2^j \times T$ from masking value table 601 to hold latching section 301-1 up to 301-42 in masking holding section 300 (S411).

Next, after delay element 102-1 up to 102-42 in PN code generating section 100 are cleared to 0 (S412), using latching section 201-1 up to 201-42 in parallel/serial converting section 200 having the latched contents of delay element 102-1 up to 102-42 that is equivalent to the previous state of PN code generating section 100 as a shift register, the number of clocks corresponding to the number of stages for a PN code (in this case, 42 clocks) are inputted as shift clock 202 and shift clock 104 to PN code generating section 100, the target state of PN code generating section 100 is obtained (S413).

At this time, the contents of delay element 102-1 up to 102-42 are latched into at latching section 201-1 up to 201-42 (S414). Then it is judged whether or not j excesses k as j=j+1 (S415). Until j excesses k, the processing from step S409 to step S414 described above is repeated.

When the state of PN code generating section reaches the state after shifted the specific times (i), shift clock 104 is inputted at the desired timing corresponding to the number of shift times (i), and the generation of PN code is initiated in PN code generating section 100 (S416).

Thus, according to the second embodiment of the present invention, it is possible to calculate the state of a PN code generator after shifted the specific times from the state of a PN code generator (the content of a shift register) at a certain time with less number of shift times than the specific number of shift times, which enables to turn off a PN code generating section during a non-reception period in an intermittent reception system. In the first embodiment, $x^i \bmod G(x)$ is calculated based on the number of shift times, however when the value of i is very large, $x^i \bmod G(x)$ is not calculated on real time. In this embodiment, the non-reception period is set at the integer times of the minimum time period T, for instance, it is assumed $2^{i}*T$ (i>0). Then masking values for $2^{i}*T$ period are pre-calculated to register in a masking table, and the states of a PN code generating section are sequentially calculated using a plurality of the masking values. According to the processes described above, the final target state of the PN code generating section is obtained.

In the above-described explanation, PN code generating section 100 is composed of a feedback shift register that is hardware to calculate the state of PN code generating section 100. It is also preferable to achieve the same processing functions as those of PN code generating section and peripheral circuits with a processor such as CPU and DSP in software.

As described above, by installing a PN code generating apparatus in the first embodiment or the second embodiment of the present invention in a mobile station apparatus in a mobile radio communication system, it is possible to reduce the power consumption the mobile station apparatus in the intermittent reception. And it is also preferable to install a PN code generating apparatus of the present invention in a base station apparatus in a mobile radio communication system. Further in the case of an information portable terminal for the radio communication in a CDMA system, it is possible to reduce the consumed electric power by comprising a PN code generating apparatus. It is also preferable to incorporate a PN code generating apparatus of the present invention into LSI or a circuit (or print board).

In the above embodiments of the present invention, an explanation is given to a PN code generating apparatus with 42 stages, however the present invention is applicable to a PN code generating apparatus with any stages.

What is claimed is:

1. A PN code generation method comprising the steps of:
   obtaining a code state at a first time;
   obtaining a length of a period from the first time to a second time that differs from the first time;
   obtaining a code state at the second time based on said code state at the first time and said length of the period from the first time to the second time, by fewer shift times than the shift times that correspond to said length of the period from the first time to the second time; and
   generating a PN code based on said code state at the second time.

2. A PN code generation method comprising the steps of:
   obtaining a code state at a first time;
   obtaining a length of a period from the first time to a second time that differs from the first time;
   obtaining a code state at the second time based on said code state at the first time and said length of the period from the first time to the second time, through shifts by the number of stages of a PN code; and
   generating a PN code based on said code state at the second time.

3. A PN code generation method comprising the steps of:
   obtaining a code state at a first time;
   obtaining a length of a period from the first time to a second time that differs from the first time;
   obtaining a code state at the second time based on said code state at the first time and said length of the period from the first time to the second time, by the number of times of shifts that corresponds to an order of a generation polynomial of a PN code; and
   generating a PN code based on said code state at the second time.

4. The PN code generation method according to claim 1, wherein said code state at the second time is identical to a code state that occurs when the PN code is generated continuously from the first time to the second time.

5. The PN code generation method according to claim 2, wherein said code state at the second time is identical to a code state that occurs when the PN code is generated continuously from the first time to the second time.

6. The PN code generation method according to claim 3, wherein said code state at the second time is identical to a code state that occurs when the PN code is generated continuously from the first time to the second time.

7. A PN code generation method comprising the steps of:
   obtaining a code state at a first time;
   obtaining a length of a period from the first time to a second time that differs from the first time;
   obtaining a sequence for obtaining a code state at the second time based on said length of the period from the first time to the second time;
   obtaining a code state at the second time based on said code state at the first time and said sequence, by fewer shift times than the shift times that correspond to said length of the period from the first time to the second time; and
   generating a PN code based on said code state at the second time.

8. A PN code generation method comprising the steps of:
   obtaining a code state at a first time;
   obtaining a length of a period from the first time to a second time that differs from the first time;
   obtaining a sequence for obtaining a code state at the second time based on said length of the period from the first time to the second time;
   obtaining a code state at the second time based on said code state at the first time and said sequence, through shifts by the number of stages of a PN code; and
   generating a PN code based on said code state at the second time.

9. A PN code generation method comprising the steps of:
   obtaining a code state at a first time;
   obtaining a length of a period from the first time to a second time that differs from the first time;
   obtaining a sequence for obtaining a code state at the second time based on said length of the period from the first time to the second time;
   obtaining a code state at the second time based on said code state at the first time and said sequence, by the number of times of shifts that corresponds to an order of a generation polynomial of a PN code; and
   generating a PN code based on the said code state at the second time.

10. A PN code generating apparatus, comprising:
    a PN code generating section that generates a PN code;
    a first obtaining section that obtains a code state of said PN code generating section at a first time;
    a second obtaining section that obtains a length of a period from the first time to a second time that differs from the first time;
    a third obtaining section that obtains a code state of said PX code generating section at the second time based on said length of the period obtained by said second obtaining section, by fewer shift times than the shift times that correspond to said length of the period from the first time to the second time; and a setting section that sets said code state obtained by said third obtaining section in said PN code generating section.

11. A PN code generating apparatus, comprising:

a PN code generating section that generates a PN code;

a first obtaining section that obtains a code state of said PN code generating section at a first time;

a second obtaining section that obtains a length of a period from the first time to a second time that differs from the first time;

a third obtaining section that obtains a code state of said PN code generating section at the second time based on the length of the period obtained by said second obtaining section, through shifts by the number of stages of the PN code; and a setting section that sets said code state obtained by said third obtaining section in said PN code generating section.

12. A PN code generating apparatus, comprising:

a PN code generating section that generates a PN code;

a first obtaining section that obtains a code state of said PN code generating section at a first time;

a second obtaining section that obtains a length of a period from the first time to a second time that differs from the first time;

a third obtaining section that obtains a code state of said PN code generating section at the second time based on said length of the period obtained by said second obtaining section, by the number of times of shifts that corresponds to an order of a generation polynomial of a PN code; and a setting section that sets said code state obtained by said third obtaining section in said PN code generating section.

13. The PN code generating apparatus according to claim 10, wherein said code state obtained by said third obtaining section is identical to a code state that occurs when the PN code is generated continuously from the first time to the second time.

14. The PN code generation apparatus according to claim 11, wherein said code state obtained by said third obtaining section is identical to a code state that occurs when the PN code is generated continuously from the first time to the second time.

15. The PN code generation apparatus according to claim 12, wherein said code state obtained by said third obtaining section is identical to a code state that occurs when the PN code is generated continuously from the first time to the second time.

16. A PN code generation program for enabling a computer to implement the steps of:

obtaining a code state at a first time;

obtaining a length of a period from the first time to a second time that differs from the first time;

obtaining a code state at the second time based on said code state at the first time and said length of the period from the first time to the second time, by fewer shift times than the shift times that correspond to said length of the period from the first time to the second time; and generating a PN code based on said code state at the second time.

17. A PN code generation program for enabling a computer to implement the steps of:

obtaining a code state at a first time;

obtaining a length of a period from the first time to a second time that differs from the first time;

obtaining a code state at the second time based on said code state at the first time and said length of the period from the first time to the second time, through shifts by the number of stages of a PN code; and generating a PN code based on said code state at the second time.

18. A PN code generation program for enabling a computer to implement the steps of:

obtaining a code state at a first time;

obtaining a length of a period from the first time to a second time that differs from the first time;

obtaining a code state at the second time based on said code state at the first time and said length of the period from the first time to the second time, by the number of times of shifts that corresponds to an order of a generation polynomial of a PN code; and generating a PN code based on said code state at the second time.

19. A PN code generating apparatus, comprising:

a PN code generating means for generating a PN code;

a first obtaining means for obtaining a code state of said PN code generating means at a first time;

a second obtaining means for obtaining a length of a period from the first time to a second time that differs from the first time;

a third obtaining means for obtaining a code state of said PN code generating means at the second time based on said length of the period obtained by said second obtaining means, by fewer shift times than the shift times that correspond to said length of the period from the first time to the second time; and a setting means for setting said code state obtained by said third obtaining means in said PN code generating means.

20. A PN code generating apparatus, comprising:

a PN code generating means for generating a PN code;

a first obtaining means for obtaining a code state of said PN code generating means at a first time;

a second obtaining means for obtaining a length of a period from the first time to a second time that differs from the first time;

a third obtaining means for obtaining a code state of said PN code generating means at the second time based on the length of the period obtained by said second obtaining means, through shifts by the number of stages of the PN code; and a setting means for setting said code state obtained by said third obtaining means in said PN code generating means.

21. A PN code generating apparatus, comprising:

a PN code generating means for generating a PN code;

a first obtaining means for obtaining a code state of said PN code generating means at a first time;

a second obtaining means for obtaining a length of a period from the first time to a second time that differs from the first time;

a third obtaining means for obtaining a code state of said PN code generating means at the second time based on said length of the period obtained by said second obtaining means, by the number of times of shifts that corresponds to an order of a generation polynomial of a PN code; and a setting means for setting said code state obtained by said third obtaining means in said PN code generating means.

22. The PN code generating apparatus according to claim 19, wherein said code state obtained by said third obtaining means is identical to a code state that occurs when the PN code is generated continuously from the first time to the second time.

23. The PN code generation apparatus according to claim 20, wherein said code state obtained by said third obtaining means is identical to a code state that occurs when the PN code is generated continuously from the first time to the second time.

24. The PN code generation apparatus according to claim 21, wherein said code state obtained by said third obtaining means is identical to a code state that occurs when the PN code is generated continuously from the first time to the second time.

* * * * *